(12) United States Patent
Huang et al.

(10) Patent No.: US 6,271,090 B1
(45) Date of Patent: Aug. 7, 2001

(54) METHOD FOR MANUFACTURING FLASH MEMORY DEVICE WITH DUAL FLOATING GATES AND TWO BITS PER CELL

(75) Inventors: Chong-Jen Huang, San-Chung; Hsin-Huei Chen, Miao-Li; Lenvis Liu, Hsin-Chu; Tony Wang, Tao-Yuan; Frank Chiou, Chi-Lung, all of (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/742,225

(22) Filed: Dec. 22, 2000

(51) Int. Cl.[7] .................................................. H01L 21/8247
(52) U.S. Cl. ............................ 438/264; 438/593; 438/594
(58) Field of Search ........................................ 438/257–267, 438/593–594

(56) References Cited

U.S. PATENT DOCUMENTS 5,143,860 * 9/1992 Mitchell et al. .
5,492,846 * 2/1996 Hara .
5,646,059 * 7/1997 Sheu et al. .
5,714,412 * 2/1998 Liang et al. .......................... 438/266
6,197,637 * 3/2001 Hsu et al. ............................. 438/257

* cited by examiner

*Primary Examiner*—Richard Booth

(57) ABSTRACT

A method for manufacturing a flash memory device with dual floating gates is disclosed. The method use a self-align etching technique to form dual floating gates by using dual spacers as masks. First of all, a semiconductor substrate having a first insulating layer thereon and a first conductive layer formed over the first insulating layer is provided. Then a second insulating layer is formed and patterned to etch to form a trench therein. Next a dielectric layer is deposited and anisotropically etched to form dual spacers in the trench. After removing the second insulating layer, etching the first conductive layer to expose the first insulating layer, and removing the spacers sequentially, dual floating gates are formed. Two doped regions separately located on two sides of said dual floating gates are then formed by using a photolithography and an ion implantation processes After thickening the first insulating layer, a composite layer, a second conductive layer and a third insulating layer is formed over the semiconductor substrate sequentially.

20 Claims, 5 Drawing Sheets

METHOD FOR MANUFACTURING FLASH MEMORY DEVICE WITH DUAL FLOATING GATES AND TWO BITS PER CELL

BACKGROUND OF THE INVENTION

1. Field of the Invention

The present invention relates to a method for manufacturing a flash memory device, and more particularly to a method for manufacturing a flash memory device with dual floating gates and two bits per cell.

2. Description of the Related Art

In the last decade, semiconductor memories have been the fastest growing segment of the semiconductor industry, with the large increase due to the rapid growth of digital electronics market with multiplying applications. Moreover, flash electrically programmable read only memories devices (EPROM) are being produced in larger quantities. Lately, high-density flash memory has been expected to share a certain part of the large computer external storage device market. One of the goals in the fabrication of flash EPROM is the production of a memory circuit that is capable of storing a maximum amount of information using a minimum amount of semiconductor surface area. However, photolithographic limits imposed by conventional semiconductor processing technology impede the achievement of this goal. Thus, the inability to pattern and etch semiconductor features closed together prevents a memory cell from occupying a smaller portion of a semiconductor's surface. Another goal of flash EPROM manufacturing is use of a simple cheap high yielding process. Many previous methods to reduce device size add too much complexity and cost.

Flash EPROM frequently uses a floating gate avalanche injection metal oxide semiconductor (FAMOS) structure to store information. Floating gate dimensions in a FAMOS memory cell are conventionally established with reference to minimum photolithographic limits and therefore produce undesirable large memory cells. A conventional configuration for an EPROM device is the stacked gate structure as shown in FIG. 1. Source 12 and Drain 14 regions are formed in substrate 10. The floating gate 16 overlies the channel region, the area between the source and drain. The control gate 18 overlays the floating gate 16. An insulating structure 20 insulates the substrate, floating gate and control gate. The minimum size of the conventional stacked gate structure is determined by the photolithographic limits which determine the floating gate, control gate, source and drain widths.

In view of the drawbacks of the prior method used to manufacture flash memory devices set forth, it is very necessary to provide a method that can overcome the photolithography limits, meanwhile, reduce the cost and complexity amid the process of manufacturing the flash memory devices. It is towards those goals that the present invention is specifically directed.

SUMMARY OF THE INVENTION

It is therefore an object of the invention to provide a method for manufacturing flash EPROM devices with dual floating gates and two bits per cell, and overcoming the photolithographic limits of imposed by conventional semiconductor processing technology to manufacture smaller flash EPROM devices.

It is another object of this invention to overcome the photolithographic limits and increase the integration of the flash memory circuit by using the technique of self-align etching of the dual floating gates.

It is a further object of this invention to reduce the cost of manufacturing the flash memory circuit by omitting the photolithography process of manufacturing the floating gates.

To achieve these objects, and in accordance with the purpose of the invention, the invention uses a self-align etching technique to form dual floating gates by using dual spacers as masks. First of all, a semiconductor substrate comprising a first insulating layer formed conformally thereon, and a first conductive layer formed over the first insulating layer is provided. Then a second insulating layer is formed over the first conductive layer. A central region pattern is next transferred into the second insulating layer to form a trench and expose the first conductive layer. A dielectric layer is then deposited over the semiconductor substrate. The dielectric layer is anisotropically etched to form dual spacers separately laterally adjacent sidewalls of said trench and expose the second insulating layer. After removing the second insulating layer, the first conductive layer is etched by using the dual spacers as masks to form dual floating gates and expose the first insulating layer. After removing the dual spacers, two doped regions separately located on two sides of said dual floating gates are then formed by using a photolithography and an ion implantation processes. After thickening the first insulating layer, a composite layer, a second conductive layer and a third insulating layer is formed over the semiconductor substrate sequentially.

It is to be understood that both the foregoing general description and the following detailed description are exemplary and explanatory only and are not restrictive of the invention, as claimed.

BRIEF DESCRIPTION OF THE DRAWINGS

The objects, features and advantages of the method for the present invention will be apparent from the following description in which.

DESCRIPTION OF THE PREFERRED EMBODIMENT

It is to be understood and appreciated that the process steps and structures described below do not cover a complete process flow for the manufacture of the flash memory device. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form. In practice the flash memory device structure will be one of many supported on a common substrate connected with suitable metallurgy in various electronic circuit configurations.

Figure 1:
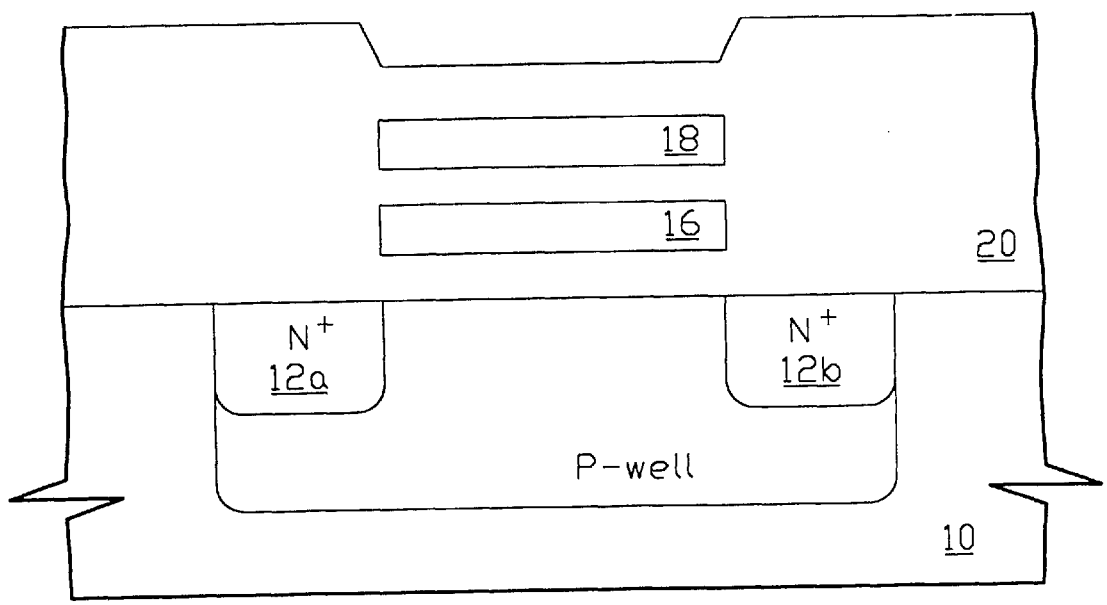
FIG. 1 is a schematic cross-sectional diagram that illustrates a conventional dual gates EPROM device.
Figure 2:
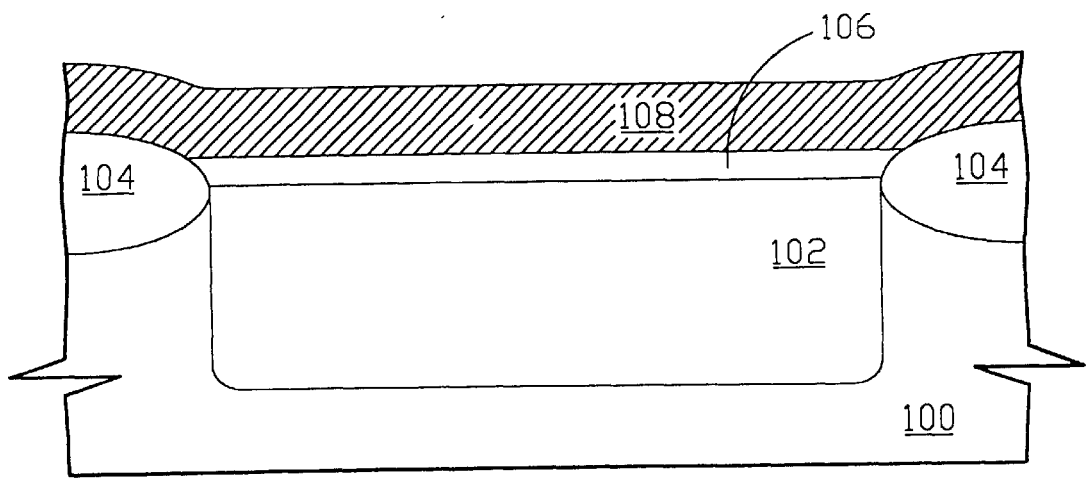
FIG. 2 shows a semiconductor substrate comprising a first insulating layer formed conformally thereon, and a first conductive layer formed over the first insulating layer.

Referring to FIG. 2, there is shown substrate 100 which shall be a silicon semiconductor substrate, as is well known in the art. The semiconductor substrate 100 is preferably a monocrystalline silicon with a crystalline orientation of <100>. The background substrate dopant can be either n-type or p-type impurity, and is preferably p-type boron with a concentration in the range of $10^{14}$ to $10^{16}$ atoms/cm$^3$. For this illustration, the device will be formed in a P-well 102 in the semiconductor substrate 100. In alternative, a conventional twin well process can be used wherein N-type metal oxide semiconductor (NMOS) devices can be formed in the wells. This allows both NMOS and PMOS devices to be formed on the same substrate. Also shown in FIG. 2, field oxide regions 104 are formed by using the conventional local oxidation of silicon (LOCOS) method for isolating active regions. Next, a first insulating layer 106, which is used as a thin tunnel layer, is formed on the surface of the semiconductor substrate 100 by using a conventional dry oxidation method at about 800° C. to about 1200° C., and it is preferably a silicon dioxide layer with a thickness in the range of about 50 to 200 angstroms and preferably 60 angstroms. Then a first conductive layer 108 is formed over the semiconductor substrate 100. The first conductive layer 108 is preferably a polysilicon layer with a thickness of about 500 to 1500 angstroms, and preferably 800 angstroms. Furthermore, it can be formed by using conventional chemical vapor deposition (CVD) methods, and preferably a LPCVD process. The precursor of the LPCVD process is silane (SiH$_4$). By heating at a temperature of between 600° C. to 650° C. and a pressure of between 0.3 torr to 0.6 torr, silane decompose to form polysilicon and hydrogen (H$_2$)

Figure 3:
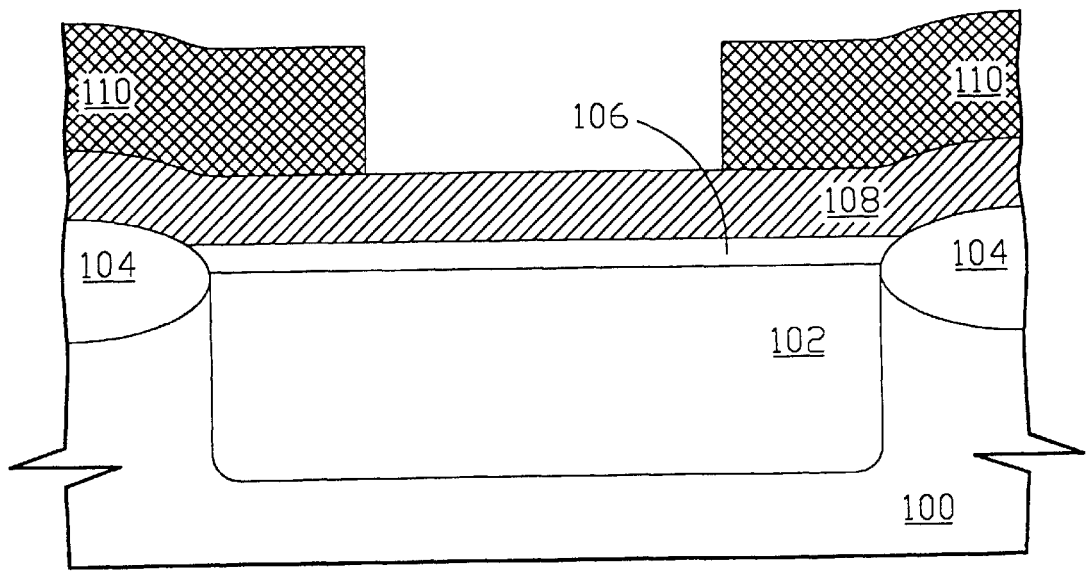
FIG. 3 shows a result of forming a second insulating layer over the illustrated structure shown in FIG. 2 and etching the same.

Referring to FIG. 3, a second insulating layer 110 is formed over the conductive layer 108 shown in FIG. 2, and etched to form a trench with a width of about 1000 to about 3500 angstroms. The second insulating layer 110 is preferably a silicon dioxide layer. The silicon dioxide 110 can be formed by using a conventional CVD process, and preferably a LPCVD process. The precursors of the LPCVD process are dichlorosilane (SiCl$_2$H$_2$), nitrous oxide (NO$_2$) and the reacting temperature is from about 650° C. to about 850° C. Moreover, the second insulating layer 110 is formed of a thickness of about 1500 to about 2500 angstroms.

Figure 4:
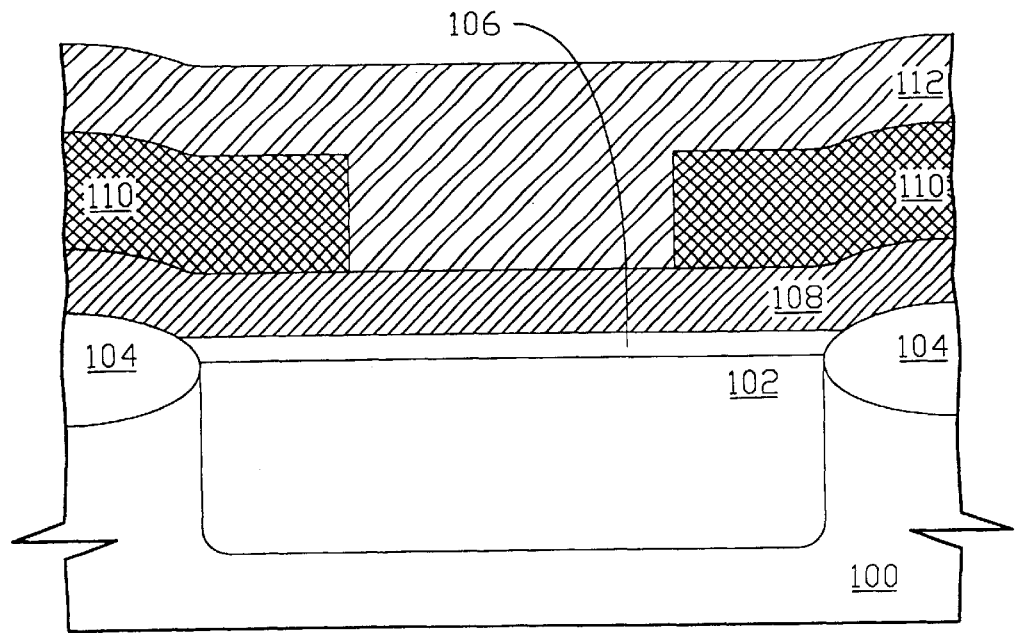
FIG. 4 shows a result of forming a dielectric layer over the structure illustrated in FIG. 3.

Referring to FIG. 4, a dielectric layer 112 is deposited over the structure illustrated in FIG. 3. The dielectric layer 112 is preferably a silicon nitride layer formed by using a conventional CVD process, and preferably a LPCVD process. The thickness of the silicon nitride layer 112 is preferably about 1000 to 2000 angstroms. The precursors of the low pressure chemical vapor deposition process are dichlorosilane (SiCl$_2$H$_2$), ammonia (NH$_3$) and the reacting temperature is from about 650° C. to about 800° C.

Figure 5:
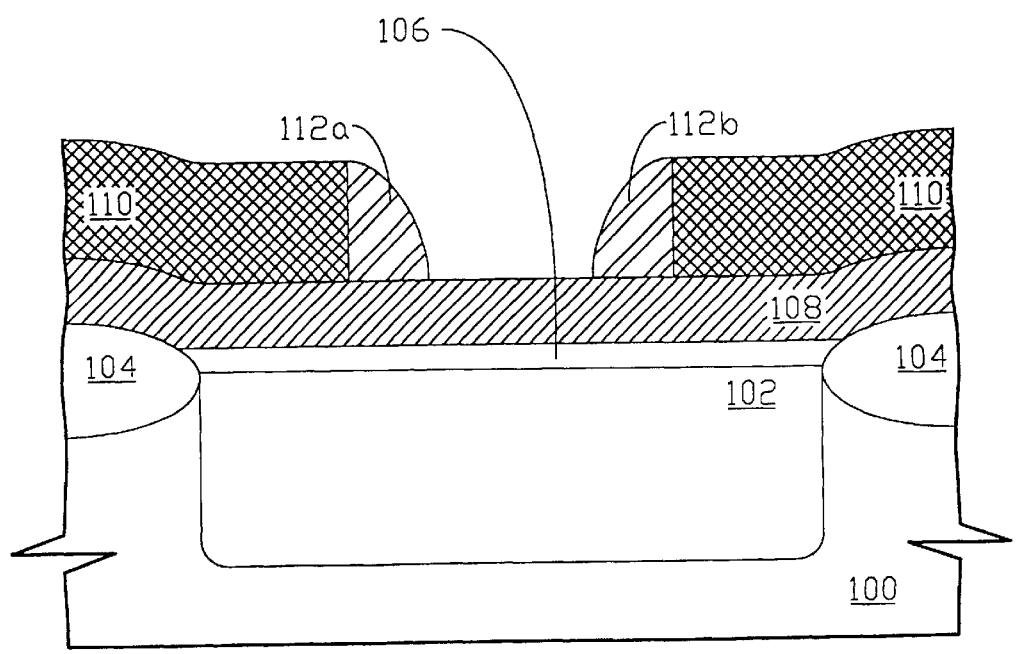
FIG. 5 shows a result of anisotropically etching the dielectric layer to form dual spacers.

Referring to FIG. 5, dual spacers 112a, 112b are formed by anisotropically etching the dielectric layer 112. The etching process is preferably a dry etching process, for example, a reactive ion etching (RIE) process. The RIE process preferably uses carbon tetrafluoride (CF$_4$) plasma and a radio frequency of 13.56 MHz. The dual spacers 112a, 112b is preferably formed with a width of about 500 to 1500 angstroms.

Figure 6:
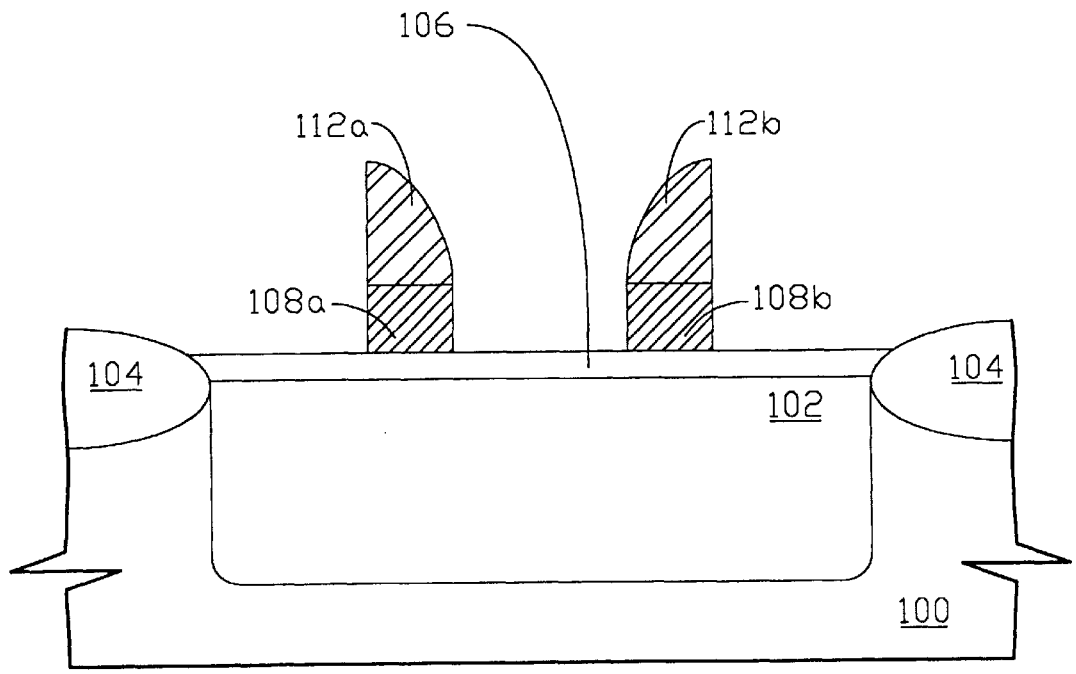
FIG. 6 shows a result of sequentially removing the dielectric layer, and etching the first conductive layer.

Referring to FIG. 6, the second insulating layer 110 is removed, and the first conductive layer 108 is self-align etched sequentially by using the dual spacers as masks to form dual floating gates 108a, 108b with a gate-to-gate space in the range of about 100 to 500 angstroms and expose the first insulating layer 106. The second insulating layer 110, which is preferably a silicon dioxide layer, is removed by using a conventional etching process. The etching process is preferably a wet etching process that uses a mixture of hydrofluoric acid (HF) and ammonium fluoride (NH$_4$F) solution. As one major key point of the present invention, the dual floating gates 108a, 108b are formed by self-align etching the first conductive layer 108 without using any photolithography process, thereby overcoming the photolithography limits amid the size-minimizing processing of the floating gate of the flash memory device. The conductive layer 108 can be etched by using a conventional etching method, for example, a dry etching process that use silicon tetrachloride (SiCl$_4$) and chlorine (Cl$_2$) plasma.

Figure 7:
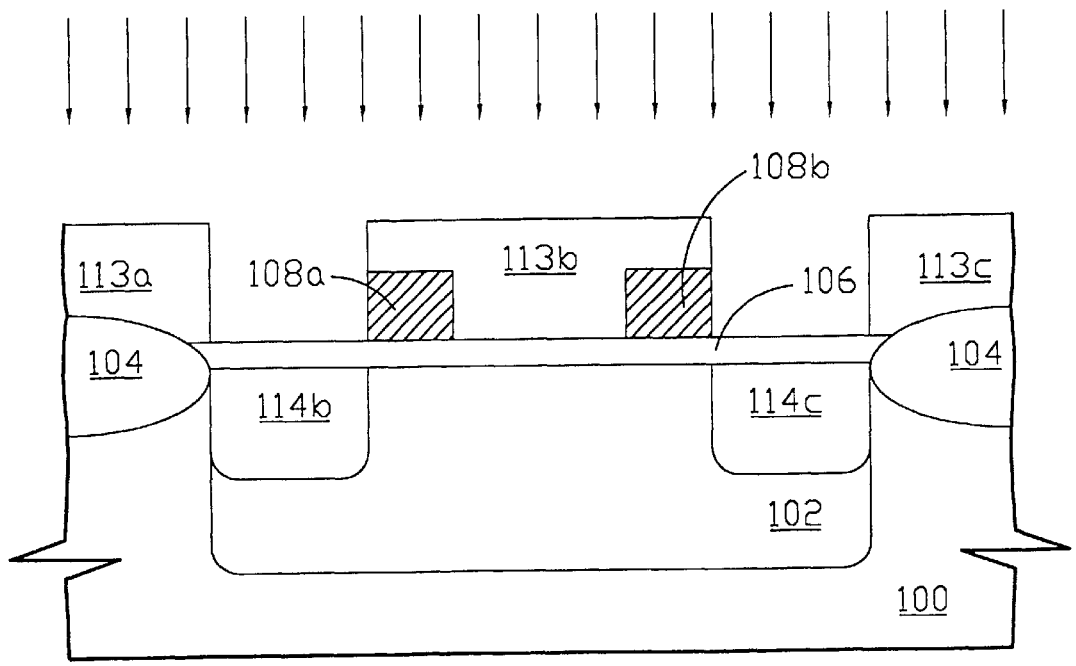
FIG. 7 shows a result of removing the spacers and forming doped regions by using a photolithography and an ion implantation processes.

Referring to FIG. 7, the dual spacers 112a, 112b are removed by using a conventional etching process, and preferably a wet etching process. The wet etching process is preferably a wet etching process used a heated phosphoric acid solution as its etching solution. Also shown in FIG. 7, a photoresist layer is formed over the semiconductor substrate 100, and photoresist layers 113a, 113b and 113c are formed by using a conventional photolithography process to define doped regions 114b and 114c. The doped regions 114b and 114c are formed in the semiconductor substrate 100 by implanting ions into the same. The ions can be either n-type or p-type impurities implanted with an implant energy in the range of about 20 to about 150 Kev, and a dosage in the range of about $0.5 \times 10^{14}$ to about $2 \times 10^{18}$ atoms/cm$^2$. The ions implanted to form the doped regions 114b and 114c are preferably phosphorus.

Figure 8:
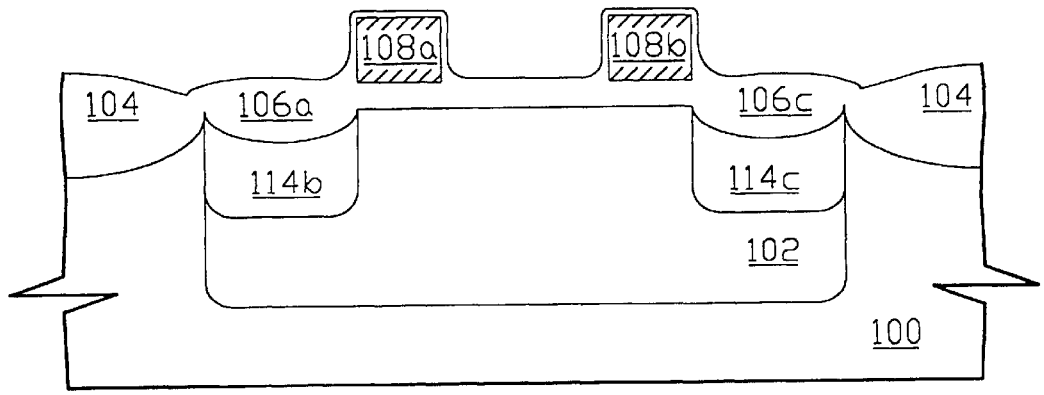
FIG. 8 shows a result of thickening the first insulating layer.

Referring to FIG. 8, the first insulating layer 106, which is preferably a silicon dioxide layer, is thickened by using a conventional dry oxidation process. Two thick insulating layers 106a and 106c are formed, and an oxide layer on the dual floating gates 108a, 108b is also formed at the same time. The thickened insulating layers 106a and 106c are formed with a thickness in the range of about 80 to about 300 angstroms.

Figure 9:
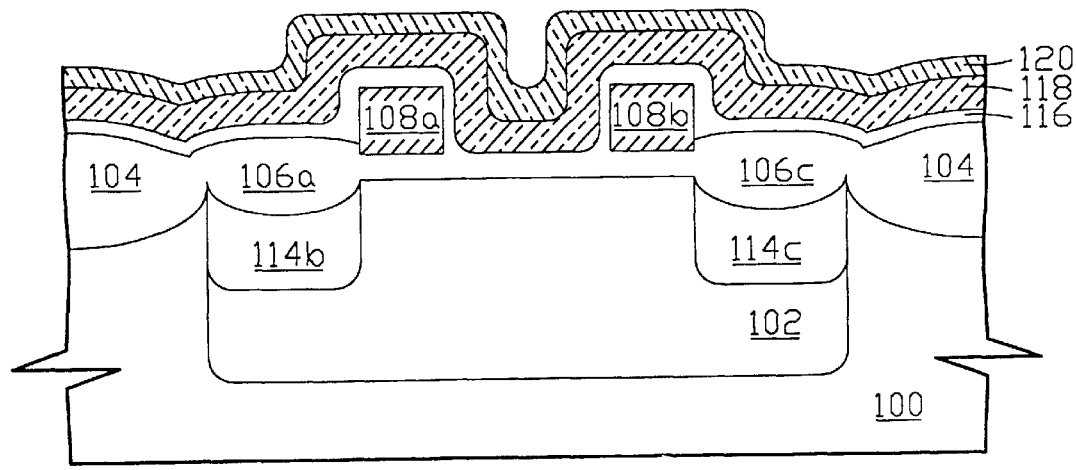
FIG. 9 shows a result of forming a composite layer, a second conductive layer and a third insulating layer sequentially over the structure shown in FIG. 8.

Referring to FIG. 9, firstly, a composite layer 116 is formed over the illustrated structure shown in FIG. 8. The composite layer is preferably formed of a sandwich structure comprising a silicon oxide layer, a silicon nitride layer and a silicon dioxide layer, which is also called an ONO layer formed by using a conventional method. The silicon dioxide layers are preferably formed of a thickness about 60 to about 120 angstroms, and the silicon nitride layer is formed of a thickness about 50 to about 100 angstroms. In addition, the oxide layer formed on the dual floating gates 108a, 108b shown in FIG. 8 can be used as one silicon dioxide layer of the ONO layer. Also shown in FIG. 9, a second conductive layer 118 used as control gates is formed over the ONO layer 116, and it is preferably a polysilicon layer formed by a conventional method. A third insulating layer 120, which is preferably a silicon dioxide layer, is formed over the second conductive layer 118. The silicon dioxide layer 120 can be formed by using a similar method used to form the silicon dioxide layer 110.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A method for manufacturing a flash memory device with dual floating gates and two bits per cell, said method comprising:

providing a semiconductor substrate doped with impurity ions of a first conductivity type comprising a first insulating layer formed conformally thereon, and a first conductive layer formed over said first insulating layer;

forming a second insulating layer over said first conductive layer;

transferring a central region pattern into said second insulating layer to form a trench and expose said first conductive layer;

forming a dielectric layer over said semiconductor substrate;

anisotropically etching said dielectric layer to form dual spacers separately laterally adjacent sidewalls of said trench and expose said second insulating layer;

removing said second insulating layer;

etching said first conductive layer by using said dual spacers as masks to form dual floating gates, and expose said first insulating layer;

removing said dual spacers;

forming a photoresist layer over said semiconductor substrate;

transferring two doped region patterns into said photoresist layer to form two trenches separately located on two sides of said dual floating gates, and expose said first insulating layer by using a photolithography process;

implanting impurity ions of a second conductivity type into said semiconductor substrate by using said photoresist layer and said dual floating gates as masks to form two doped regions separately located on two sides of said dual floating gates;

thickening said first insulating layer;

forming a composite layer over said semiconductor substrate;

forming a second conductive layer over said composite layer;

and forming a third insulating layer over said second conductive layer.

2. The method according to claim 1, wherein said first conductivity type is n-type.

3. The method according to claim 1, wherein said first conductivity type is p-type.

4. The method according to claim 1, wherein said first insulating layer is a silicon dioxide layer.

5. The method according to claim 1, wherein said first conductive layer is a polysilicon layer.

6. The method according to claim 1, wherein said second insulating layer is a silicon dioxide layer.

7. The method according to claim 1, wherein said dielectric layer is a silicon nitride layer.

8. The method according to claim 1, wherein said second conductivity type is n-type.

9. The method according to claim 1, wherein said second conductivity type is p-type.

10. The method according to claim 1, wherein said composite layer is formed of a sandwich structure comprising a silicon dioxide layer, a silicon nitride layer and a silicon dioxide layer.

11. The method according to claim 1, wherein said second conductive layer is a polysilicon layer.

12. The method according to claim 1, wherein said third insulating layer is a silicon dioxide layer.

13. A method for manufacturing a flash memory device with dual floating gates and two bits per cell, said method comprising:

providing a semiconductor substrate doped with p-type impurity ions comprising a tunnel oxide layer formed conformally thereon, and a polysilicon layer formed over said tunnel oxide layer;

forming an oxide layer over said polysilicon layer;

transferring a central region pattern into said oxide layer to form a trench and expose said polysilicon layer;

forming a dielectric layer over said semiconductor substrate;

anisotropically etching said dielectric layer to form dual spacers separately laterally adjacent sidewalls of said trench and expose said oxide layer;

removing said oxide layer;

etching said polysilicon layer by using said dual spacers as masks to form dual floating gates, and expose said tunnel oxide layer;

removing said dual spacers;

forming a photoresist layer over said semiconductor substrate;

transferring two doped region patterns into said photoresist layer to form two trenches separately located on two sides of said dual floating gates, and expose said tunnel oxide layer by using a photolithography process;

implanting impurity ions into said semiconductor substrate by using said photoresist layer and said dual floating gates as masks to form two doped regions separately located on two sides of said dual floating gates;

thickening said tunnel oxide layer;

forming a composite layer over said semiconductor substrate;

forming a polysilicon layer over said composite layer; and forming a silicon dioxide layer over said polysilicon layer.

14. The method according to claim 13, wherein said dielectric layer is a silicon nitride layer.

15. The method according to claim 13, wherein said impurity ions are n-type impurity ions.

16. The method according to claim 1, wherein said impurity ions are p-type impurity ions.

17. The method according to claim 13, wherein said composite layer is formed of a sandwich structure comprising a silicon dioxide layer, a silicon nitride layer and a silicon dioxide layer.

18. A method for manufacturing a flash memory device with dual floating gates and two bits per cell, said method comprising:

providing a semiconductor substrate doped with p-type impurity ions comprising a tunnel oxide layer formed conformally thereon, and a first polysilicon layer formed over said tunnel oxide layer;

forming a first oxide layer over said first polysilicon layer;

transferring a central region pattern into said first oxide layer to form a trench and expose said first polysilicon layer;

forming a dielectric layer over said semiconductor substrate;

anisotropically etching said dielectric layer to form dual spacers separately laterally adjacent sidewalls of said trench and expose said first oxide layer;

removing said first oxide layer;

etching said first polysilicon layer by using said dual spacers as masks to form dual floating gates, and expose said tunnel oxide layer;

removing said dual spacers;

forming a photoresist layer over said semiconductor substrate;

transferring two doped region patterns into said photoresist layer to form two trenches separately located on two sides of said dual floating gates, and expose said tunnel oxide layer by using a photolithography process;

implanting n-type impurity ions into said semiconductor substrate by using said photoresist layer and said dual floating gates as masks to form two doped regions separately located on two sides of said dual floating gates;

thickening said tunnel oxide layer;

forming a composite layer over said semiconductor substrate;

forming a second polysilicon layer over said composite layer;

and forming a second oxide layer over said second polysilicon layer.

19. The method according to claim 18, wherein said dielectric layer is a silicon nitride layer.

20. The method according to claim 18, wherein said composite layer is formed of a sandwich structure comprising a silicon dioxide layer, a silicon nitride layer and a silicon dioxide layer.

* * * * *